US007969448B2

(12) United States Patent
Yang et al.

(10) Patent No.: US 7,969,448 B2
(45) Date of Patent: Jun. 28, 2011

(54) APPARATUS AND METHOD OF CONVERTING IMAGE SIGNAL FOR SIX COLOR DISPLAY DEVICE, AND SIX COLOR DISPLAY DEVICE HAVING OPTIMUM SUBPIXEL ARRANGEMENT

(75) Inventors: Young-Chol Yang, Gunpo-si (KR); Seong-Deok Lee, Yongin-si (KR); Chang-Yeong Kim, Yongin-si (KR); Mun-Pyo Hong, Seongnam-si (KR); Nam-Seok Roh, Seongnam-si (KR); Won-Hee Choe, Gyeongju-si (KR); Hyun-Wook Ok, Yongin-si (KR); Ho-Young Lee, Suwon-si (KR); Du-Sik Park, Suwon-si (KR); Keun-Kyu Song, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 1102 days.

(21) Appl. No.: 10/579,951

(22) PCT Filed: Nov. 20, 2004

(86) PCT No.: PCT/KR2004/003020
§ 371 (c)(1),
(2), (4) Date: Mar. 23, 2007

(87) PCT Pub. No.: WO2005/050296
PCT Pub. Date: Jun. 2, 2005

(65) Prior Publication Data

US 2008/0049042 A1 Feb. 28, 2008

(30) Foreign Application Priority Data

Nov. 20, 2003 (KR) ........................ 10-2003-0082563
Nov. 26, 2003 (KR) ........................ 10-2003-0084556

(51) Int. Cl.

| | |
|---|---|
| ***G09G 5/36*** | (2006.01) |
| ***G09G 5/00*** | (2006.01) |
| ***G09G 5/02*** | (2006.01) |
| ***H04N 9/083*** | (2006.01) |
| ***G03F 3/08*** | (2006.01) |
| ***G06K 9/00*** | (2006.01) |
| ***G06K 9/40*** | (2006.01) |
| *G09G 5/10* | (2006.01) |
| *H04N 5/202* | (2006.01) |
| *H04N 1/46* | (2006.01) |
| *G06K 9/32* | (2006.01) |

(52) U.S. Cl. .......... 345/589; 345/88; 345/613; 345/690; 345/581; 348/271; 348/254; 348/277; 348/557; 358/518; 358/525; 382/165; 382/254; 382/274; 382/300

(58) Field of Classification Search .................... 345/88, 345/690, 589–591, 600, 77, 597, 606, 613, 345/643–644, 581, 694, 426, 586, 204; 348/253–254, 271, 277, 278, 519, 538, 557, 348/560, 582, 612, 708; 358/518–519, 525, 358/446; 382/162–165, 167, 254; 349/1, 349/97, 106
See application file for complete search history.

(56) References Cited

U.S. PATENT DOCUMENTS 4,845,550 A 7/1989 Urabe
(Continued)

FOREIGN PATENT DOCUMENTS

JP 2589330 B 12/1996
(Continued)

OTHER PUBLICATIONS

PCT International Search Report; International Application No. PCT/KR2004/003020; International filing date: Nov. 20, 2004; Date of Mailing: Jan. 28, 2005.

(Continued)

*Primary Examiner* — Wesner Sajous
(74) *Attorney, Agent, or Firm* — Cantor Colburn LLP

(57) ABSTRACT

A method of converting image signals for a display device including six-color subpixels is provided, which includes: classifying three-color input image signals into maximum, middle, and minimum; decomposing the classified signals into six-color components; determining a maximum among the six-color components; calculating a scaling factor; and extracting six-color output signals.

33 Claims, 14 Drawing Sheets

U.S. PATENT DOCUMENTS

| | | | | |
|---|---|---|---|---|
| 5,587,819 | A * | 12/1996 | Sunohara et al. | 349/106 |
| 6,262,744 | B1 | 7/2001 | Carrein | |
| 6,621,497 | B1 | 9/2003 | Sugiura | |
| 6,888,604 | B2 * | 5/2005 | Rho et al. | 349/146 |
| 7,483,011 | B2 * | 1/2009 | Yang et al. | 345/88 |
| 7,755,652 | B2 * | 7/2010 | Credelle et al. | 345/694 |
| 2003/0016373 | A1 | 1/2003 | Asamura | |
| 2003/0081231 | A1 | 5/2003 | Kagawa | |
| 2005/0083341 | A1 * | 4/2005 | Higgins et al. | 345/590 |
| 2005/0088385 | A1 * | 4/2005 | Elliott et al. | 345/87 |
| 2006/0139527 | A1 * | 6/2006 | Chang et al. | 349/114 |
| 2007/0070086 | A1 * | 3/2007 | Brown Elliott et al. | 345/613 |
| 2008/0192178 | A1 * | 8/2008 | Ben-David et al. | 349/68 |
| 2009/0102855 | A1 * | 4/2009 | Brown Elliott et al. | 345/589 |

FOREIGN PATENT DOCUMENTS

| | | | |
|---|---|---|---|
| JP | 9-251160 | | 9/1997 |
| JP | 10-307205 | | 11/1998 |
| JP | 11-202318 | | 7/1999 |
| JP | 11-272244 | | 10/1999 |
| JP | 2000-356768 | | 12/2000 |
| JP | 2001-186370 | A | 7/2001 |
| JP | 2001186371 | | 7/2001 |
| JP | 2001307080 | | 11/2001 |
| JP | 2003179765 | | 6/2003 |
| JP | 2003179766 | | 6/2003 |
| KR | 1020010029676 | | 4/2001 |
| KR | 20030059330 | | 7/2003 |
| KR | 1020030073834 | | 9/2003 |
| KR | 1020030086399 | A | 11/2003 |
| KR | 1020030089632 | | 11/2003 |

OTHER PUBLICATIONS

Billmeyer and Saltzman, Principles of Color Technology, 2nd Ed., John Wiley & Sons, Inc., pp. 50, (1981).

* cited by examiner

FIG. 17

| Magenta | Coord. x | Coord. y | LUM |
|---|---|---|---|
| 2 | 0.327038285 | 0.18711 | 100.0 |
| 1.8 | 0.3246111231 | 0.193028 | 101.2 |
| 1.6 | 0.322195168 | 0.199955 | 102.6 |
| 1.4 | 0.31979066 | 0.208016 | 104.3 |
| 0.2 | 0.317398796 | 0.217345 | 106.3 |
| 1 | 0.315021374 | 0.22807 | 108.6 |
| 0.8 | 0.312661088 | 0.240314 | 111.5 |
| 0.6 | 0.310321722 | 0.254181 | 115.0 |
| 0.4 | 0.308008316 | 0.269747 | 1119.1 |
| 0.2 | 0.305727265 | 0.287048 | 124.2 |
| 0 | 0.30348633 | 0.306066 | 130.4 |

APPARATUS AND METHOD OF CONVERTING IMAGE SIGNAL FOR SIX COLOR DISPLAY DEVICE, AND SIX COLOR DISPLAY DEVICE HAVING OPTIMUM SUBPIXEL ARRANGEMENT

BACKGROUND OF THE INVENTION (a) Field of the Invention

The present invention relates to apparatus and method of converting image signals for six color display device, and a six color display device having a optimum subpixel arrangement.

(b) Description of the Related Art

Recently, flat panel displays such as organic light emitting displays, plasma display panels, and liquid crystal displays are widely developed.

The liquid crystal display (LCD) is a representative of the flat panel displays. The LCD includes a liquid crystal (LC) panel assembly including two panels provided with two kinds of field generating electrodes such as pixel electrodes and a common electrode and a LC layer with dielectric anisotropy interposed therebetween. The variation of the voltage difference between the field generating electrodes, i.e., the variation in the strength of an electric field generated by the electrodes changes the transmittance of the light passing through the LCD, and thus desired images are obtained by controlling the voltage difference between the electrodes.

The LCD includes a plurality of pixels including three sub-pixels representing red, green and blue colors.

However, the three primary color system has a limit for some ranges of colors such as high concentration cyan. This may be overcome by using cyan as one of primary colors. However, the addition of cyan may decrease the luminance of the display device. In order to solve this problem, magenta and yellow as well as cyan are added to primary colors to form a six primary color system.

However, the conventional six-color display device has a color fringe error that a color is recognized near edges of the small characters. In addition, the displayed images may have spots.

Moreover, the luminance is required to be increased.

SUMMARY OF THE INVENTION

A motivation of the present invention is to solve the problems of the conventional technique.

A method of converting image signals for a display device including six-color subpixels is provided, which includes: classifying three-color input image signals into maximum, middle, and minimum; decomposing the classified signals into six-color components; determining a maximum among the six-color components; calculating a scaling factor; and extracting six-color output signals.

The three-color signals may include red, green and blue signals and the six-color signals may include red, green, blue, cyan, magenta, and yellow signals.

The decomposition may include: expressing a predetermined number of terms of coordinates with coefficients.

The coefficients may include first to third coefficients expressed as the maximum, middle, and minimum, and the coordinates may be assigned to the six-color signals.

The six-color components may include a first term expressed as a multiplication of the first coefficient and first to sixth coordinates, a second term expressed as a multiplication of the second coefficient and the first, second, and sixth coordinates, and a third term expressed as a multiplication of the third coefficient and the first coordinate.

The six-color components may include a first term expressed as a multiplication of the first coefficient and first to sixth coordinates, a second term expressed as a multiplication of the second coefficient and the sixth coordinate, and a third term expressed as a multiplication of the third coefficient and the first coordinate.

The first to the third terms may be further decomposed into the first to sixth coordinates to be expressed as a multiplication of fourth to ninth coefficients and first to sixth coordinates.

The calculation of the scaling factor may include: determining a maximum among the coefficients; and calculating a ratio of the maximum among the fourth to ninth coefficients and the maximum among the three-color signals to determine the scaling factor.

The scaling factor may be equal to or larger than one.

The extraction of the six-color signals may include: multiplying the scaling factor to the fourth to ninth coefficients.

A device of converting image signals for a display device including six-color subpixels is provided, which includes: a signal controller converting three-color input signals into six-color output signals; a gray voltage generator generating a plurality of gray voltages; and a data driver converting into the six-color signals into data voltages selected among the gray voltages and supplying the data voltages to the subpixels, wherein the signal controller comprises: a magnitude comparator comparing the three-color signals; a decomposer decomposing the three-color signals into six-color components; a scaler calculating a scaling factor based on signals from the magnituded comparator and the decomposer; and a signal extractor multiplying the scaling fact to the six-color components.

The three-color signals may include red, green and blue signals and the six-color signals may include red, green, blue, cyan, magenta, and yellow signals.

The scaling factor may be defined as a ratio of the maximum among the six-color components and the maximum among the three-color signals.

The signal extractor may obtain increments by multiplying the scaling factor to the six-color components.

A display device is provided, which includes: a plurality of pixel arranged in matrix, each pixel including first and second sets of three primary color subpixels, wherein the subpixels are arranges so that two subpixels having complementary relation is adjacent to each other.

The subpixels may be arranged in a 2×3 matrix or a 3×2 matrix.

The first set of three primary color subpixels may be arranged in a row or a column, and the second set of three primary color subpixels may be arranged in a row or a column.

A subpixel having the lowest luminance may be disposed at a side.

Three subpixels having relatively high luminance may be distributed over different rows or columns.

The three high-luminance subpixels may be distributed over two rows or two columns.

The three high-luminance subpixels may be arranged symmetrically in a row or column direction.

Two subpixels having relatively high luminance may be arranged in a diagonal.

The first or the second set of three primary color subpixels may include a white subpixel.

The first set of three primary color subpixels may include red, green and blue subpixels, and the second set of three primary color subpixels may include cyan, magenta, and yellow subpixels.

The first set of three primary color subpixels may include red, green and blue subpixels, and the second set of three primary color subpixels may include cyan, white, and yellow subpixels.

The subpixels may be arranged in a 2×3 matrix or a 3×2 matrix.

The first set of three primary color subpixels may be arranged in a row or a column, and the second set of three primary color subpixels may be arranged in a row or a column.

The blue subpixel may be disposed at a side and the green subpixel may be disposed at a center.

The green, cyan, and yellow subpixels may have luminance higher than other subpixels.

The green subpixel may be disposed at a side.

The green and yellow subpixels may have luminance higher than other subpixels.

BRIEF DESCRIPTION OF THE DRAWINGS

The present invention will become more apparent by describing embodiments thereof in detail with reference to the accompanying drawing in which:

FIG. 17 is a table showing luminance variation depending on the variation of magenta.

DETAILED DESCRIPTION OF THE PREFERRED EMBODIMENTS

Figure 1:
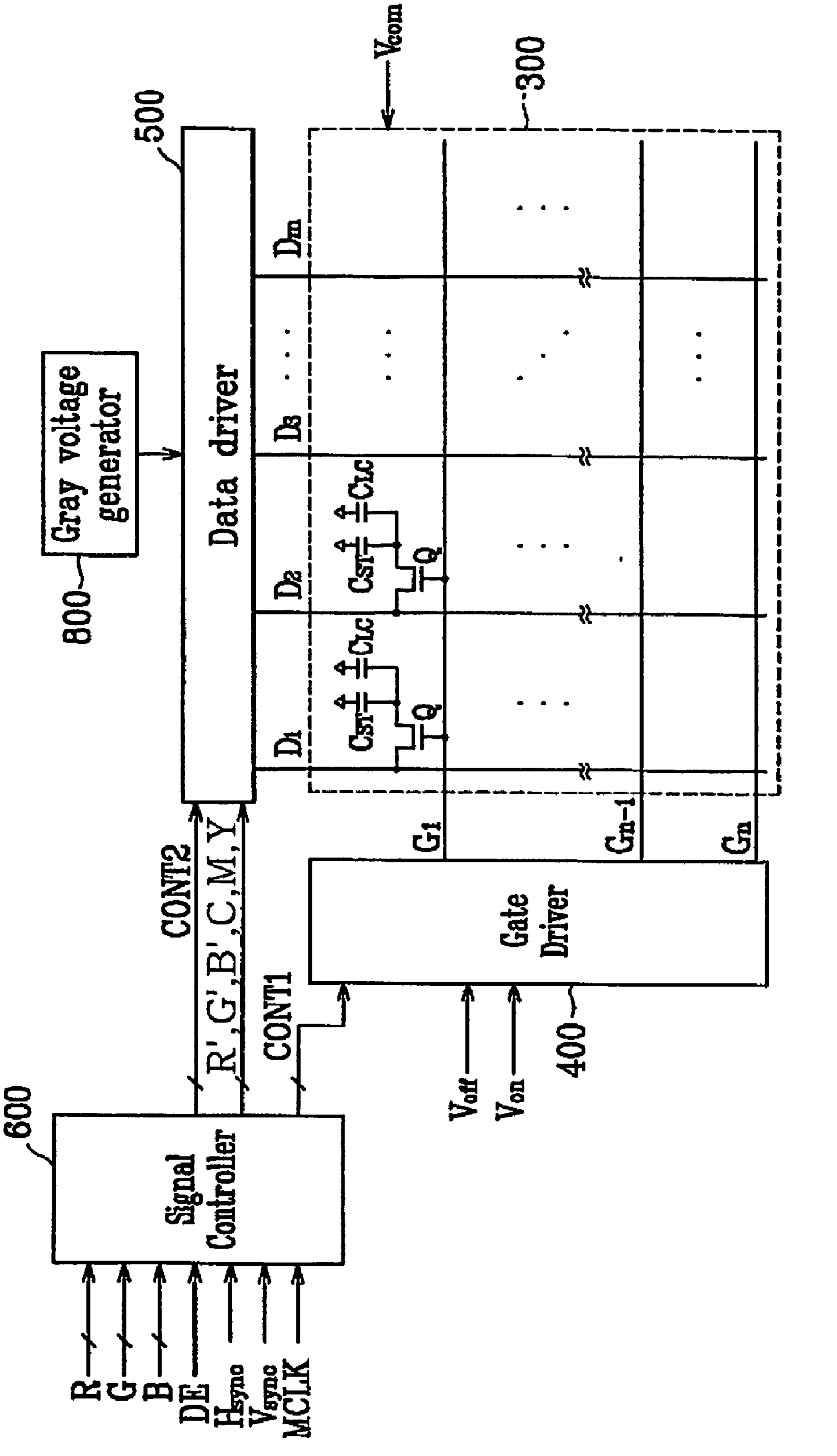
FIG. 1 is a block diagram of an LCD according to an embodiment of the present invention.

The present invention now will be described more fully hereinafter with reference to the accompanying drawings, in which embodiments of the invention are shown.

In the drawings, the thickness of layers and regions are exaggerated for clarity. Like numerals refer to like elements throughout. It will be understood that when an element such as a layer, region or substrate is referred to as being "on" another element, it can be directly on the other element or intervening elements may also be present. In contrast, when an element is referred to as being "directly on" another element, there are no intervening elements present.

Figure 2:
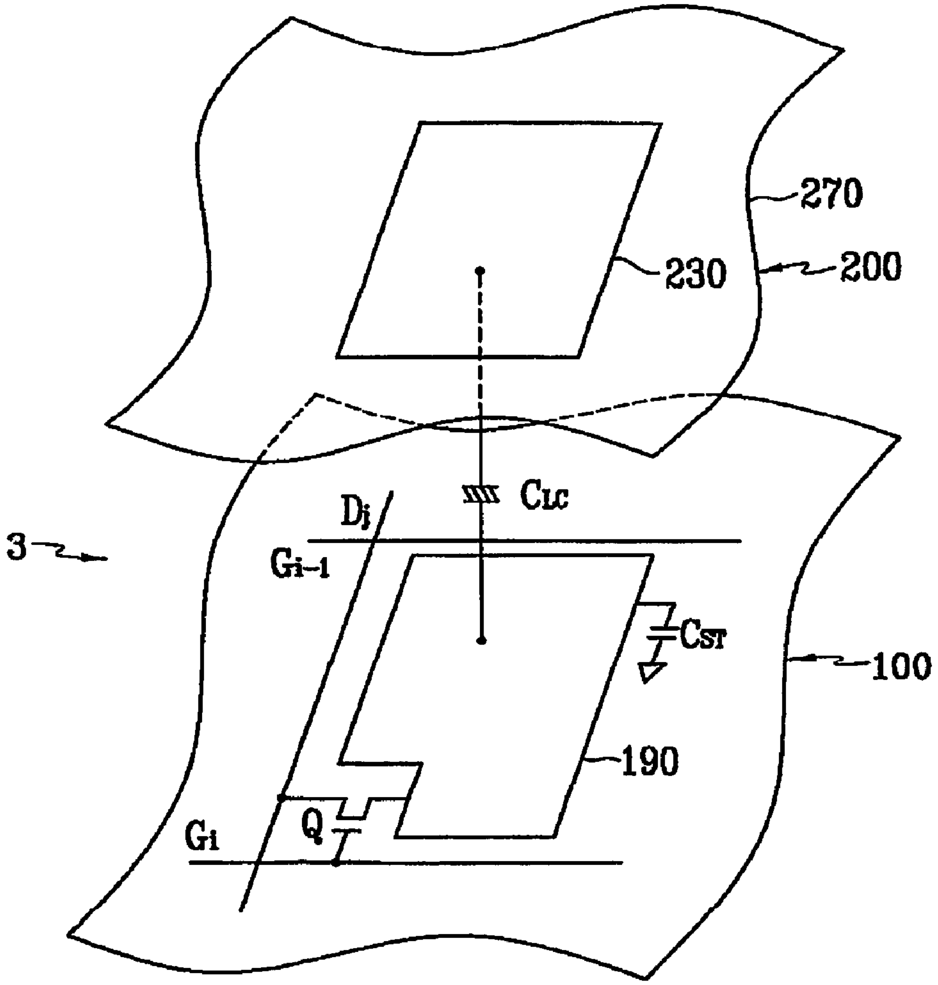
FIG. 2 is an equivalent circuit diagram of a subpixel of an LCD according to an embodiment of the present invention.

FIG. 1 is a block diagram of an LCD according to an embodiment of the present invention, and FIG. 2 is an equivalent circuit diagram of a subpixel of an LCD according to an embodiment of the present invention.

Referring to FIG. 1, an LCD according to an embodiment includes a LC panel assembly 300, a gate driver 400 and a data driver 500 that are connected to the panel assembly 300, a gray voltage generator 800 connected to the data driver 500, and a signal controller 600 controlling the above elements.

Referring to FIG. 1, the panel assembly 300 includes a plurality of display signal lines $G_1$-$G_n$ and $D_1$-$D_m$ and a plurality of subpixels connected thereto and arranged substantially in a matrix. In a structural view shown in FIG. 2, the panel assembly 300 includes lower and upper panels 100 and 200 and a LC layer 3 interposed therebetween.

The display signal lines $G_1$-$G_n$ and $D_1$-$D_m$ are disposed on the lower panel 100 and include a plurality of gate lines $G_1$-$G_n$ transmitting gate signals (also referred to as "scanning signals"), and a plurality of data lines $D_1$-$D_m$ transmitting data signals. The gate lines $G_1$-$G_n$ extend substantially in a row direction and substantially parallel to each other, while the data lines $D_1$-$D_m$ extend substantially in a column direction and substantially parallel to each other.

Each subpixel includes a switching element Q connected to the signal lines $G_1$-$G_n$ and $D_1$-$D_m$, and a LC capacitor $C_{LC}$ and a storage capacitor $C_{ST}$ that are connected to the switching element Q. If unnecessary, the storage capacitor $C_{ST}$ may be omitted.

The switching element Q including a TFT is provided on the lower panel 100 and has three terminals: a control terminal connected to one of the gate lines $G_1$-$G_N$; an input terminal connected to one of the data lines $D_1$-$D_m$; and an output terminal connected to both the LC capacitor $C_{LC}$ and the storage capacitor $C_{ST}$.

The LC capacitor $C_{LC}$ includes a pixel electrode 190 provided on the lower panel 100 and a common electrode 270 provided on an upper panel 200 as two terminals. The LC layer 3 disposed between the two electrodes 190 and 270 functions as dielectric of the LC capacitor $C_{LC}$. The pixel electrode 190 is connected to the switching element Q, and the common electrode 270 is supplied with a common voltage Vcom and covers an entire surface of the upper panel 200. Unlike FIG. 2, the common electrode 270 may be provided on the lower panel 100, and both electrodes 190 and 270 may have shapes of bars or stripes.

The storage capacitor $C_{ST}$ is an auxiliary capacitor for the LC capacitor $C_{LC}$. The storage capacitor $C_{ST}$ includes the pixel electrode 190 and a separate signal line, which is provided on the lower panel 100, overlaps the pixel electrode 190 via an insulator, and is supplied with a predetermined voltage such as the common voltage Vcom. Alternatively, the storage capacitor $C_{ST}$ includes the pixel electrode 190 and an adjacent gate line called a previous gate line, which overlaps the pixel electrode 190 via an insulator.

For color display, each subpixel uniquely represents one of primary colors (i.e., spatial division) or each subpixel sequentially represents the primary colors in turn (i.e., temporal division) such that spatial or temporal sum of the primary colors are recognized as a desired color. FIG. 2 shows an example of the spatial division that each subpixel includes a color filter 230 representing one of the primary colors in an area of the upper panel 200 facing the pixel electrode 190. Alternatively, the color filter 230 is provided on or under the pixel electrode 190 on the lower panel 100.

An example of a set of the primary colors includes red, green, and blue colors or complementary colors thereof, i.e., cyan, magenta, and yellow colors.

The above-described six colors is referred to as six primary colors hereinafter, and red, green and blue colors are referred to as first three primary colors, while cyan, magenta, and yellow colors are referred to as second three primary colors. The six primary colors preferably satisfy the positions at the color coordinates defined by TABLE 1.

TABLE 1

| | |
|---|---|
| Red | Red, Reddish-Orange |
| Green | Green |
| Blue | Blue, Purplish Blue, Bluish-Purple |
| Cyan | Bluish-Green, Blue-Green, Greenish Blue |
| Magenta | Red-Purple, Reddish-Purple, Purplish-Pink, Reddish-Purple, Purple |
| Yellow | Yellow, Orange, Yellowish-Orange, Greenish-Yellow, Yellow-Green |

TABLE 1 is quoted from Billmeyer and Saltzman, Principles of Color Technology, 2nd Ed., John Wiley & Sons, Inc., pp. 50.

One or more polarizers (not shown) are attached to at least one of the panels 100 and 200.

Referring to FIG. 1 again, the gray voltage generator 800 generates two sets of a plurality of gray voltages related to the transmittance of the subpixels. The gray voltages in one set have a positive polarity with respect to the common voltage Vcom, while those in the other set have a negative polarity with respect to the common voltage Vcom.

The gate driver 400 is connected to the gate lines $G_1$-$G_n$ of the panel assembly 300 and synthesizes the gate-on voltage Von and the gate-off voltage Voff from an external device to generate gate signals for application to the gate lines $G_1$-$G_n$.

The data driver 500 is connected to the data lines $D_1$-$D_m$ of the panel assembly 300 and applies data voltages, which are selected from the gray voltages supplied from the gray voltage generator 800, to the data lines $D_1$-$D_m$.

The drivers 400 and 500 may include at least one integrated circuit (IC) chip mounted on the panel assembly 300 or on a flexible printed circuit (FPC) film in a tape carrier package (TCP) type, which are attached to the LC panel assembly 300. Alternately, the drivers 400 and 500 may be integrated into the panel assembly 300 along with the display signal lines $G_1$-$G_n$ and $D_1$-$D_m$ and the TFT switching elements Q.

The signal controller 600 controls the gate driver 400 and the gate driver 500.

Now, the operation of the above-described LCD will be described in detail.

The signal controller 600 is supplied with input three-color image signals R, G and B and input control signals controlling the display thereof such as a vertical synchronization signal Vsync, a horizontal synchronization signal Hsync, a main clock MCLK, and a data enable signal DE, from an external graphics controller (not shown). After generating gate control signals CONT1 and data control signals CONT2 and converting and processing the input image signals R, G and B into six-color image signals R', G', B', C, M and Y suitable for the operation of the panel assembly 300 on the basis of the input control signals and the input image signals R, G and B, the signal controller 600 transmits the gate control signals CONT1 to the gate driver 400, and the processed image signals R', G', B', C, M and Y and the data control signals CONT2 to the data driver 500.

The gate control signals CONT1 include a scanning start signal STV for instructing to start scanning and at least a clock signal for controlling the output time of the gate-on voltage Von. The gate control signals CONT1 may further include an output enable signal OE for defining the duration of the gate-on voltage Von.

The data control signals CONT2 include a horizontal synchronization start signal STH for informing of start of data transmission for a group of subpixels, a load signal LOAD for instructing to apply the data voltages to the data lines $D_1$-$D_m$, and a data clock signal HCLK. The data control signal CONT2 may further include an inversion signal RVS for reversing the polarity of the data voltages (with respect to the common voltage Vcom).

Responsive to the data control signals CONT2 from the signal controller 600, the data driver 500 receives a packet of the image data R', G', B', C, M and Y for the group of subpixels from the signal controller 600, converts the image data R', G', B', C, M and Y into analog data voltages selected from the gray voltages supplied from the gray voltage generator 800, and applies the data voltages to the data lines $D_1$-$D_m$.

The gate driver 400 applies the gate-on voltage Von to the gate line $G_1$-$G_n$ in response to the gate control signals CONT1 from the signal controller 600, thereby turning on the switching elements Q connected thereto. The data voltages applied to the data lines $D_1$-$D_m$ are supplied to the subpixels through the activated switching elements Q.

The difference between the data voltage and the common voltage Vcom is represented as a voltage across the LC capacitor $C_{LC}$, which is referred to as a subpixel voltage. The LC molecules in the LC capacitor $C_{LC}$ have orientations depending on the magnitude of the subpixel voltage, and the molecular orientations determine the polarization of light passing through the LC layer 3. The polarizer(s) converts the light polarization into the light transmittance.

By repeating this procedure by a unit of the horizontal period (which is denoted by "1H" and equal to one period of the horizontal synchronization signal Hsync and the data enable signal DE), all gate lines $G_1$-$G_n$ are sequentially supplied with the gate-on voltage Von during a frame, thereby applying the data voltages to all subpixels. When the next frame starts after finishing one frame, the inversion control signal RVS applied to the data driver 500 is controlled such that the polarity of the data voltages is reversed (which is referred to as "frame inversion"). The inversion control signal RVS may be also controlled such that the polarity of the data voltages flowing in a data line in one frame are reversed (for example, line inversion and dot inversion), or the polarity of the data voltages in one packet are reversed (for example, column inversion and dot inversion).

Now, methods and devices of converting image signals according embodiments of the present invention will be described in detail.

First, methods of converting image signals are described in detail.

Hereinafter, image signals representing white, red, green, blue, cyan, magenta, and yellow colors are referred to as white, red, green, blue, cyan, magenta, and yellow signals and denoted by W, R, G, B, C, M, and Y.

The signal conversion converts a set of three input signals representing one of the second three primary colors (referred to as a target color) into a set of six output signals also representing the target color. Here, two conversion methods are suggested, a mixed color method and a pure color method. The pure color method represents any one of the second three primary colors only with the corresponding color signal, while the mixed color method represents the color with the corresponding color signal and other two of the first three primary color signals. In other words, the pure color method makes the five output signals zero other than the output color signal representing the target color, while the mixed color method makes other two of the first primary color signals nonzero.

TABLE 2 illustrates the two conversion methods for 8-bit image signals representing 256 grays.

TABLE 2

| | input | | | mixed | | | | | | pure | | | | | |
|---|---|---|---|---|---|---|---|---|---|---|---|---|---|---|---|
| | R | G | B | R | G | B | C | M | Y | R | G | B | C | M | Y |
| WHITE | 255 | 255 | 255 | 255 | 255 | 255 | 255 | 255 | 255 | 255 | 255 | 255 | 255 | 255 | 255 |
| RED | 255 | 0 | 0 | 255 | 0 | 0 | 0 | 0 | 0 | 255 | 0 | 0 | 0 | 0 | 0 |
| GREEN | 0 | 255 | 0 | 0 | 255 | 0 | 0 | 0 | 0 | 0 | 255 | 0 | 0 | 0 | 0 |
| BLUE | 0 | 0 | 255 | 0 | 0 | 255 | 0 | 0 | 0 | 0 | 0 | 255 | 0 | 0 | 0 |
| CYAN | 0 | 255 | 255 | 0 | 255 | 255 | 255 | 0 | 0 | 0 | 0 | 0 | 255 | 0 | 0 |
| MAGENTA | 255 | 0 | 255 | 255 | 0 | 255 | 0 | 255 | 0 | 0 | 0 | 0 | 0 | 255 | 0 |
| YELLOW | 255 | 255 | 0 | 255 | 255 | 0 | 0 | 0 | 255 | 0 | 0 | 0 | 0 | 0 | 255 |

The first column indicates colors represented by image signals, the second column indicates grays of input signals, the third column indicates grays of output signals in the mixed color method, and the fourth column indicates grays of output signals in the pure color method.

It is noted in TABLE 2 that white color is represented by using all of six nonzero output signals for increasing the luminance.

Now, the mixed color method and the pure color method according to embodiments of the present invention will be described in detail with reference to FIG. 3.

Figure 3:
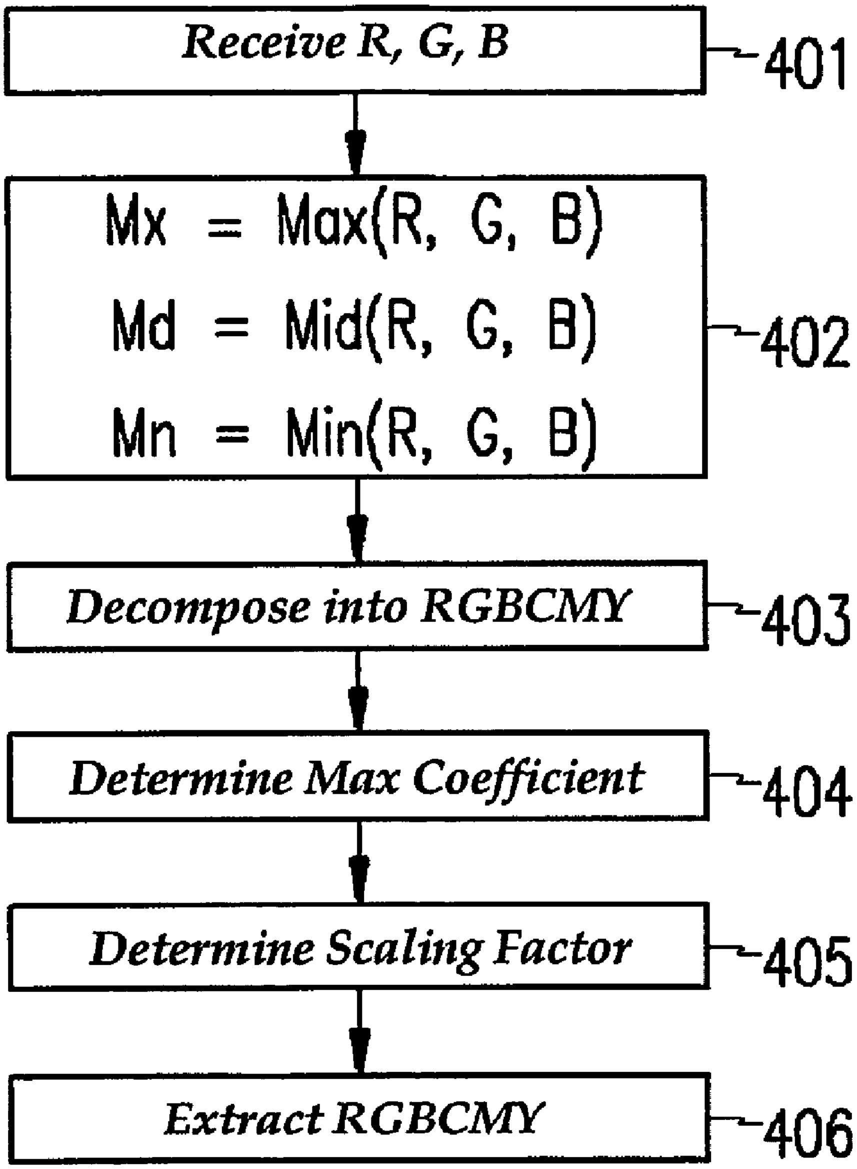
FIG. 3 is a flow chart illustrating the conversion of the image signals.

FIG. 3 is a flow chart illustrating the conversion of the image signals.

First, the mixed color method is described in detail (401).

A set of three input color signals are inputted and classified into three level, maximum Mx, middle Md, and minimum Mn depending on their relative values or relative luminance represented by the signals (402).

Figure 4:
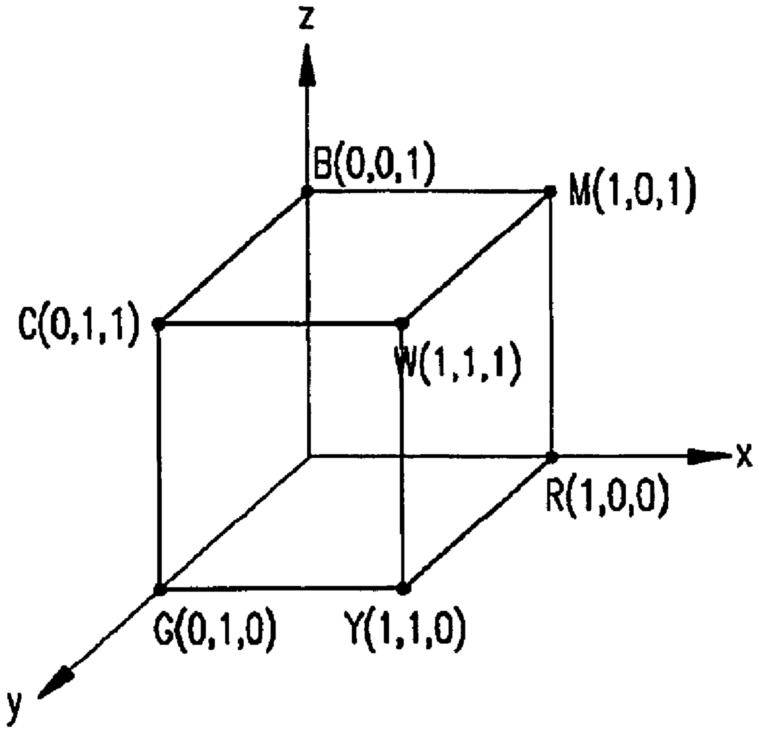
FIG. 4 illustrates the conversion according to an embodiment of the present invention.

The classified signals are then decomposed into six color components (403), which is illustrated in FIG. 4.

Referring to FIG. 4, the first three primary color signals R, G and B are represented as axes of the three dimensional color coordinates. For example, x, y, and z axes represent red, green, and blue signals R, G and B and the values of the signals are normalized. The cyan, magenta, and yellow signals C, M and Y have a zero component and two nonzero components having equal values.

In other words, a cyan signal C is made by adding a green signal G and a blue signal G such that it is complementary to the red color signal R, and it is represented by a coordinate (0, c, c). Similarly, magenta and yellow signals M and Y are represented by coordinates (m, 0, m) and (y, y, 0), respectively, and complementary to the green signal G and the blue signal B, respectively. Here, the complementary relation of two colors means that the addition of the two colors can result in white color. In FIG. 4, the coordinates of the white signal W are (w, w, w) and thus two color signals in a complementary relation can be added to generate white color.

Figure 5:
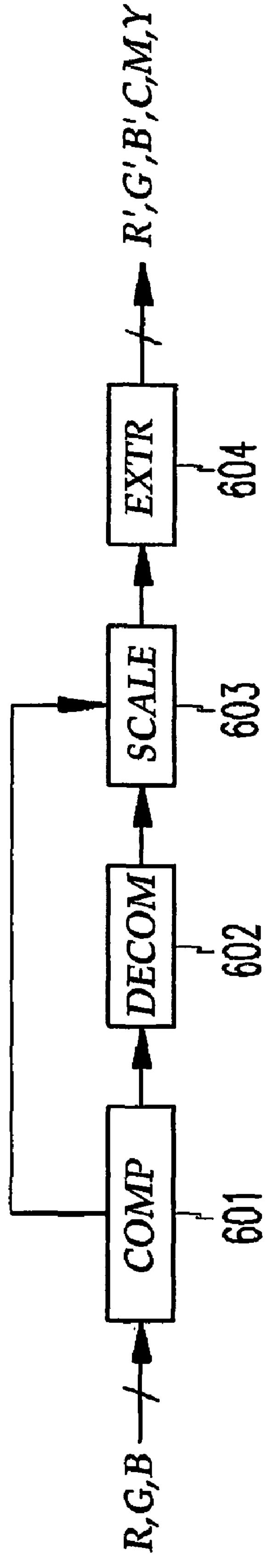
FIG. 5 is a block diagram of a signal modifier according to an embodiment of the present invention, which may be integrated in the signal controller 600 shown in FIG. 1 or implemented as a stand-alone device.

The set of the input signals R, G and B represent a point (Mx, Md, Mn) in a color coordinate system like that shown in FIG. 5.

Extraction of the minimum Mn yields:

$$\begin{aligned}(Mx, Md, Mn) &= (Mn, Mn, Mn) + (Mx - Mn, Md - Mn, 0) \quad \text{(a)}\\ &= (Mn, Mn, Mn) + \\ &\quad (Md - Mn, Md - Mn, 0) + \\ &\quad (Mx - Md, 0, 0)\\ &= Mn(1, 1, 1) + (Md - Mn)(1, 1, 0) + \\ &\quad (Mx - Md)(1, 0, 0).\end{aligned}$$

Considering the six color coordinates, Equation (a) is rewritten:

$$(Mx,Md,Mn)=(Mn/3)[(1,0,0)+(0,1,0)+(0,0,1)+(0,1,1)+(1,0,1)+(1,1,0)]+[(Md-Mn)/2][(1,0,0)+(0,1,0)+(1,1,0)]+(Mx-Md)(1,0,0) \quad \text{(b)}$$

Therefore, $$(Mx,Md,Mn)=(Mx-Md/2-Mn/6)(1,0,0)+(Md/2-Mn/6)(0,1,0)+(Mn/3)(0,0,1)+(Mn/3)(0,1,1)+(Mn/3)(1,0,1)+(Md/2-Mn/6)(1,1,0). \quad \text{(c)}$$

Equation (c) includes three coefficients, i.e., (Mx−Md/2−Mn/6), (Md/2−Mn/6), (Mn/3) and a maximum coefficient is determined (404).

For this purpose, the differences between the coefficients are calculated as follows:

$$(Mx-Md/2-Mn/6)-(Md/2)=Mx-Md\geqq 0, \text{ and}$$

$$(Md/2-Mn/6)-(Mn/3)=(Md-Mn)/2\geqq 0.$$

Accordingly, it is determined that the coefficient of (1, 0, 0); i.e., (Mx−Md/2−Mn/6) is the maximum.

Next, a scaling factor is calculated (405).

The scaling factor S1 is given by a ratio of the maximum Mx of the input three-color signals to the maximum (Mx−Md/2−Mn/6) of the above-calculated six color components.

$$S1=Mx/(Mx-Md/2-Mn/6) \quad (1)$$

Equation 1 shows that the scaling factor S1 is equal to or larger than one.

Equation 1 is established considering the adjustment of the maximum value of output six color signals. The scaling factor is multiplied to the coefficients obtained by Equation to obtain increments. The multiplication of the scaling factor conserves the order of the values of the image signals. The multiplication yields:

$$Mx'=S1(Mx-Md/2-Mn/6);$$

$$Md'=S1(Md/2-Mn/6);$$

$$Mn'=S1(Mn/3);$$

$$cMx'=S1(Mn/3);$$

$$cMd'=S1(Mn/3); \text{ and}$$

$$cMn'=S1(Md/2-Mn/6), \quad (2)$$

where Mx', Md' and Mn' denote maximum, middle, and minimum values after the multiplication, respectively, and cMx', cMd' and cMn' denote the signals having a complementary relation to maximum, middle, and minimum signals.

Equation 2 is rewritten as follows:

$$Mx'=Mx$$

$$Md'=(3Md-Mn)\times Mx/(6Mx-3Md-Mn)$$

$$Mn'=2Mn\times Mx/(6Mx-3Md-Mn)$$

$$cMx'=2Mn\times Mx/(6Mx-3Md-Mn)$$

$$cMd'=2Mn\times Mx/(6Mx-3Md-Mn)$$

$$cMn'=(3Md-Mn)\times Mx/(6Mx-3Md-Mn) \quad (3)$$

Equation 3 tells that the maximum, the middle, and the minimum input image signals R, G and B keeps their order the values and thus the output signals for second primary colors are also determined. Accordingly, the six color output signals are determined.

Next, the pure color method will be described in detail.

Like Equation (a), $$\begin{aligned}(Mx, Md, Mn) &= (Mn, Mn, Mn) + (Mx-Mn, Md-Mn, 0) \quad (d)\\ &= (Mn, Mn, Mn) + \\ &\quad (Md-Mn, Md-Mn, 0) + \\ &\quad (Mx-Md, 0, 0)\\ &= Mn(1,1,1) + (Md-Mn)(1,1,0) + \\ &\quad (Mx-Md)(1,0,0).\end{aligned}$$

Equation is rewritten like Equation (b):

$$(Mx,Md,Mn)=(Mn/3)[(1,0,0)+(0,1,0)+(0,0,1)+(0,1,1)+(1,0,1)+(1,1,0)]+(Md-Mn)(1,1,0)+(Mx-Md)(1,0,0). \quad (e)$$

It is noted that the coefficient for the second term (1, 1, 0) is different from that in Equation (b). That is, the second term in Equation (d) includes no coefficient for (1, 0, 0) and (0, 1, 0) for remaining only a signal for pure second primary color, and thus the coefficient for (1, 1, 0) is altered.

Equation (e) is rewritten with respect to the colors to yield:

$$(Mx,Md,Mn)=(Mx-Md+Mn/3)(1,0,0)+(Mn/3)(0,1,0)+(Mn/3)(0,0,1)+(Mn/3)(0,1,1)+(Mn/3)(1,0,1)+(Md-Mn+Mn/3)(1,1,0) \quad (f)$$

Among the three coefficients (Mx−Md+Mn/3), (Md−Mn+Mn/3), and (Mn/3), the coefficient Mn/3 is the minimum and the larger one of the coefficients (Mx−Md+Mn/3) and (Md−Mn+Mn/3) depends on the values Mx, Md and Mn.

When (Mx−Md+Mn/3)2 (Md−Mn+Mn/3), the scaling factor S2 is determined by the same rule as that related to the mixed color method. That is, the scaling factor is a ratio of the maximum Mx of the input three-color signals to the maximum/(Mx−Md+Mn/3) of the above-calculated six color components:

$$S2=Mx/(Mx-Md+Mn/3) \quad (4)$$

The multiplication of the scaling factor S2 to the coefficients yield the output values as follows:

$$Mx''=Mx$$

$$Md''=3Mn\times Mx/(3Mx-3Md+Mn)$$

$$Mn''=3Mn\times Mx/(3Mx-3Md+Mn)$$

$$cMx''=3Mn\times Mx/(3Mx-3Md+Mn)$$

$$cMd''=3Mn\times Mx/(3Mx-3Md+Mn)$$

$$cMn''=(3Mn-2Mn)\times Mx/(3Mx-3Md+Mn) \quad (5)$$

When (Mx−Md+Mn/3)<(Md−Mn+Mn/3), the scaling factor S3 is also given by a ratio of the maximum Mx of the input three-color signals to the maximum (Md−Mn+Mn/3) of the above-calculated six color components:

$$S3=Mx/(Md-Mn+Mn/3). \quad (6)$$

The six color components are calculated by:

$$Mx^3=(3Mx-3Md+Mn)\times Mx/(3Md-2Mn);$$

$$Md^3=3Mn\times Mx/(3Md-2Mn);$$

$$Mn^3=3Mn\times Mx/(3Md-2Mn);$$

$$cMx^3=3Mn\times Mx/(3Md-2Mn);$$

$$cMd^3=3Mn\times Mx/(3Md-2Mn); \text{ and}$$

$$cMn^3=Mx. \quad (7)$$

Since the mixed color method displays cyan by using green and blue signals G and B as well as a cyan signal C, the displayed cyan color has luminance higher than that displayed using the pure color method. On the contrary, the pure color method displays a cyan color having higher chroma than the mixed color method since it uses only a cyan signal.

Now, a signal modifier for six color rendering according to an embodiment of the present invention will be described in detail with reference to FIG. 5.

FIG. 5 is a block diagram of a signal modifier according to an embodiment of the present invention, which may be integrated in the signal controller 600 shown in FIG. 1 or implemented as a stand-alone device.

Referring to FIG. 5, a signal modifier according to this embodiment includes a magnitude comparator 601, a decomposer 602, a scaler 603, and a signal extractor 604.

The magnitude comparator 601 compares the magnitudes (or grays) of image signals in a set of three three-color input signals, which include a red signal R, a green signal, and a blue signal B, and classifies each signal into the highest one (Mx), the middle one (Md), and the lowest one (Mn).

The decomposer 602 decomposes the set of the three-color input signals from the magnitude comparator 60 into a set of six six-color signal components.

The scaler 603 compares the six-color signal components from the decomposer 602 and determines the highest one among the six components. Thereafter, the scaler 603 calculates a scaling factor given by the ratio of the highest one (Mx) of the three input signals to the highest six-color component and calculates increments for the six-color components by multiplying the scaling factor to the six-color components.

The signal extractor 604 extracts six six-color output signals representing red, green, blue, cyan, magenta, and yellow colors based on the calculated increments from the scaler 603.

Now, arrangements of six-color subpixels on the panel assembly according to embodiments of the present invention will be described in detail with reference to FIGS. 6-16.

Hereinafter, a subpixel is referred to as red, green, blue, cyan, magenta, and yellow subpixel depending on the color represented by the subpixel and the red, green, blue, cyan, magenta, and yellow subpixels are denoted by reference characters R, G, B, C, M, and Y, respectively, which also denote the image signals for the colors.

Figure 6:
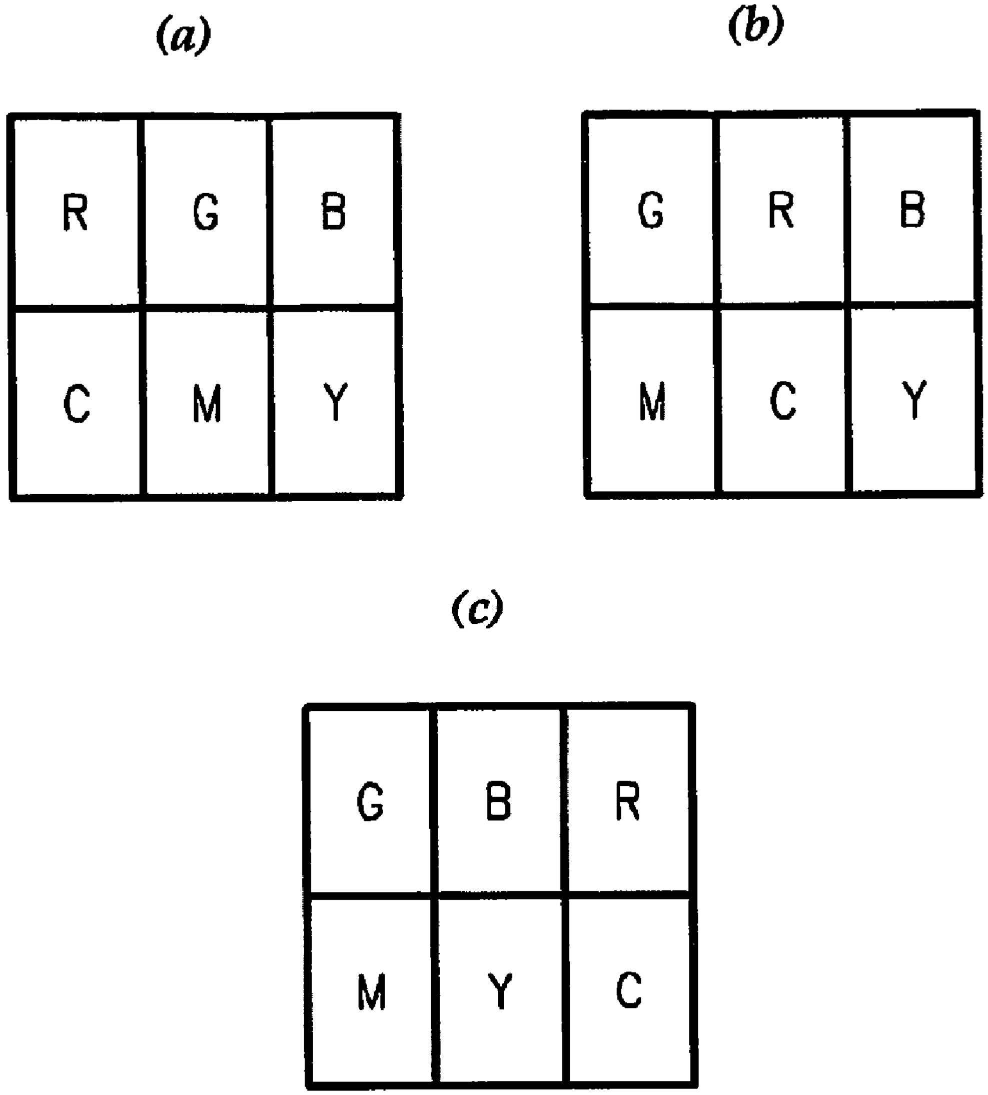
FIG. 6 shows arrangements of six six-color subpixels of an LCD according to embodiments of the present invention.

FIG. 6 shows arrangements of six six-color subpixels of an LCD according to embodiments of the present invention. It is noted that a set of red, green, blue, cyan, magenta, and yellow subpixels form a pixel that is a basic unit for displaying an image.

Referring to FIG. 6, the subpixels forming a pixel are arranged in a 2×3 matrix that includes a first row including red, green and blue subpixels R, G, and B and a second row including cyan, magenta, and yellow subpixels C, M and Y. The 2×3 matrix is approximately square and each subpixel may have a ratio in length of transverse to longitudinal edges equal to about 2:3.

The subpixels R, G, B, C, M and Y are arranged such that two complementary colors are adjacent to each other. That is, each pair of the red and the cyan subpixels R and C, the green and the magenta subpixels G and M, and the blue and the yellow subpixels B and Y, which have a complementary relation, are adjacent to each other. Accordingly, the addition of the three colors represented by the subpixels in any row and the addition of the two colors represented by the subpixels in any column row yield an achromatic color.

Disposed at centers in the two rows are the green and the magenta subpixels G and M shown in (a), the red and the cyan subpixels R and C shown in (b), and the blue and the yellow subpixels B and Y shown in (c).

These arrangements prevent color error that a color is recognized near transverse and longitudinal edges of a character displayed on an LCD, which will be described in detail.

Some experiments were conducted for proving the appropriateness of the subpixel arrangements.

The experiments obtained giant six-color subpixels using a conventional three-color LCD, each giant subpixel having the same size as a pixel including three original subpixels. For example, a giant red, green, or blue subpixel was realized by activating a subpixel representing a color corresponding thereto and inactivating other two subpixels to be dark. Similarly, a giant cyan, magenta, or yellow subpixel was realized by inactivating a subpixel representing a color complementary thereto and activating remaining two subpixels. The six giant subpixels form a giant pixel and the giant subpixels and the giant pixels will be merely referred to as subpixels and pixels unless it causes confusion.

To arrange the subpixels in order of the luminance, it was the yellow subpixel Y, the cyan subpixel C, the green subpixel G, the red subpixel R, the magenta subpixel M, and the blue subpixel B.

In addition, two cyan subpixels C having different luminance was manufactured and the lower one was one thirds of the luminance of the green subpixel G. A cyan subpixel having higher luminance will be referred to as a brighter cyan subpixel, while that having lower luminance will be referred to as a darker cyan subpixel. The different luminance of the cyan subpixel C was resulted from the different techniques for implementing a cyan color filter, one providing a single filter layer passing cyan light while the other providing two filter layers respectively passing green and blue lights. The latter generated higher luminance than the former.

First, a white longitudinal line having a width substantially equal to the width of a pixel was displayed on a dark background for various subpixel arrangements including those shown in FIG. 6. The arrangements shown in FIG. 6, where the addition of the colors in each row make an achromatic color and adjacent two colors in each column have a complementary relation, showed a clean edge of the white line, while other arrangements showed a color near the edges of the white line.

Next, white oblique lines were displayed on a dark background for the arrangements shown in FIG. 6. The oblique lines had a width substantially equal to the width of a pixel and had opposite gradients, one having positive gradient to extend from the lower left to the upper right or vice versa (referred to as "positive line" hereinafter) and the other having negative gradient to extend from the upper left to the lower right (referred to as "negative line" hereinafter). The inclination angle of the oblique lines was about 45 degrees.

In this experiment, a green dot was observed at an upper portion of the positive line for the arrangement shown in (c).

When employing a brighter cyan subpixel, the two oblique lines for the arrangement shown in (c) was observed to have slightly different widths, but it is not an eyesore. On the other hand, the arrangement shown in (a) exhibited no such a thing.

When employing a darker cyan subpixel, the two oblique lines for the arrangement shown in (c) was also observed to have slightly different widths, but it is also not an eyesore. The oblique lines for the arrangement shown in (a) were observed to smoothly proceed, but those for the arrangement shown in (a) were observed not to be continuous.

Finally, picture images displayed by the arrangements shown in (a) and (b) of FIG. 6 were observed to be excellent.

The above-described experimental results will be analyzed in detail with reference to FIGS. 7-11.

Figure 7:
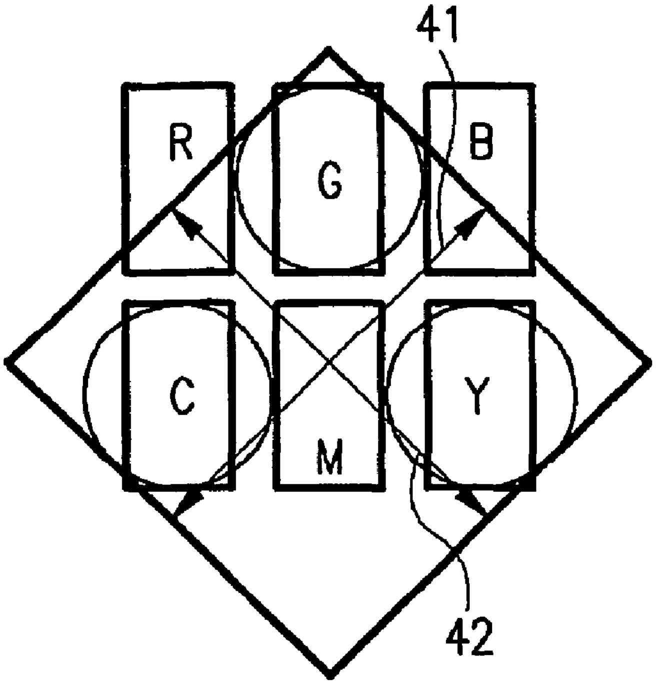
FIGS. 7 and 10 illustrate oblique lines displayed by the subpixel arrangement shown in (a) of FIG. 6, and FIGS. 8, 9 and 11 illustrate oblique lines displayed by the subpixel arrangement shown in (b) of FIG. 6.
Figure 8:
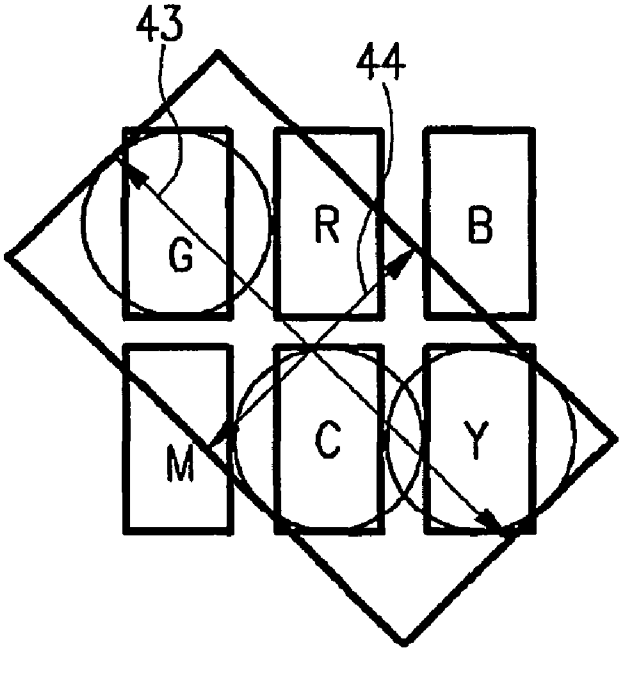
Figure 9:
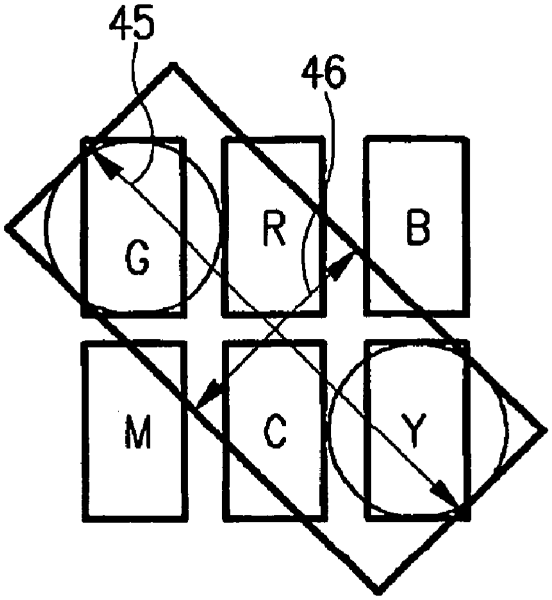
Figure 10:
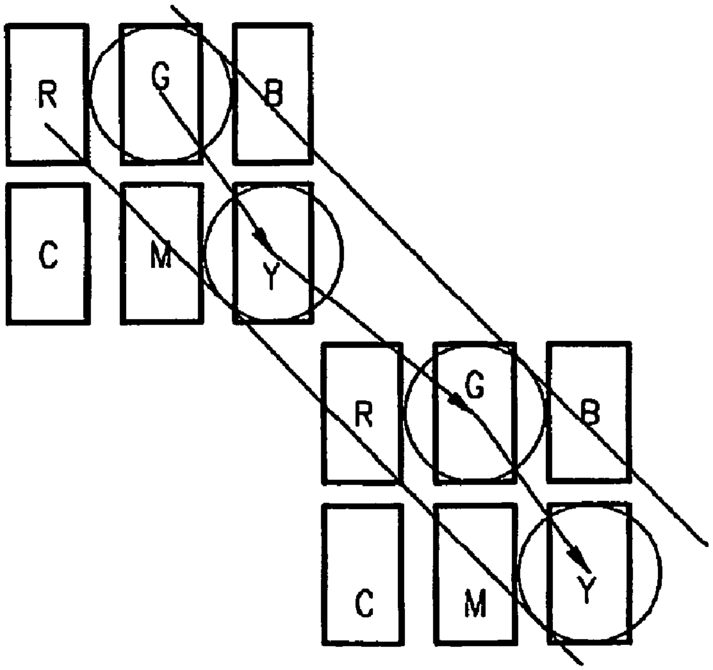

FIGS. 7 and 10 illustrate oblique lines displayed by the subpixel arrangement shown in (a) of FIG. 6, and FIGS. 8, 9 and 11 illustrate oblique lines displayed by the subpixel arrangement shown in (b) of FIG. 6.

First, it is noted that human eyes may recognize a pattern determined by the luminance of the subpixels when displaying a straight line or a circle.

The arrangement shown in (c) of FIG. 6 may separate outer colors with respect to the blue subpixel B disposed at the center since the blue subpixel B has the lowest luminance. In particular, when displaying a positive line, the darkest, blue subpixel B and the next darkest, magenta subpixel M are arranged in parallel to the oblique line, and thus a dark band formed by the darkest subpixels B and M separates the green subpixel G disposed at an upper left position from the yellow, cyan, and red subpixels Y, C and R. Accordingly, the yellow, cyan, and red subpixels Y, C and R may be recognized as portions of the oblique line, while the green subpixel G may be separated to be recognized as a green spot. This is applicable for both brighter and darker cyan subpixels C.

Next, a case employing a brighter cyan subpixel will be described.

Referring to FIG. 7, the arrangement shown in (a) of FIG. 6 symmetrically arranges three brightest subpixels, i.e., green, cyan, and yellow subpixels G, C and Y, which are enclosed by circles. Accordingly, the width of the positive line, which is determined by the green and the yellow subpixels G and Y as denoted by a reference numeral 41, is almost equal to the width of the negative line that is determined by the green and the cyan subpixels G and C as denoted by a reference numeral 42.

On the contrary, the green, cyan, and yellow subpixels G, C and Y in the arrangement shown in (b) of FIG. 6 are obliquely arranged as shown in FIG. 8. Therefore, the width of the positive line, which is determined by the green and yellow subpixels G and Y as denoted by a reference numeral 43, is larger than the width of the negative line that is determined by the cyan and yellow subpixels C and Y as denoted by a reference numeral 44.

Next, it will be described a case that the cyan subpixel C has a luminance one thirds of the luminance of the green subpixel G, which is disposed between the luminance of the red subpixel R and the luminance of the magenta subpixel M.

Referring to FIG. 9, since the cyan subpixel C is not a brightest subpixel any more, the width 46 of the negative line is determined by the green and yellow subpixels G and Y to be reduced compared with that shown in FIG. 8.

Figure 11:
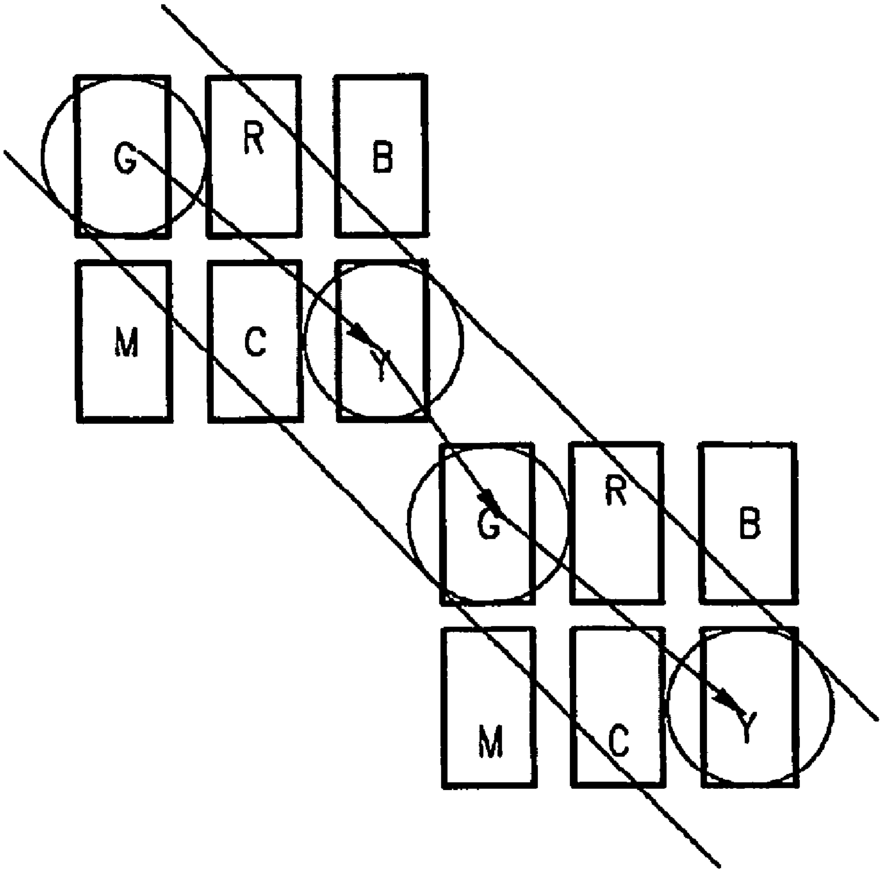

FIGS. 10 and 11 show two pixels arranged along a negative line.

Referring to FIG. 10, a straight line passing through the centers of the green subpixel G and the yellow subpixel Y in the arrangement shown in (a) of FIG. 6 is somewhat offset from a 45-degree negative oblique line. Therefore, the connection of the centers of the green and yellow subpixels G and Y may not form a perfectly straight line and thus a displayed oblique line may appear coarse.

However, a straight line passing through the centers of the green subpixel G and the yellow subpixel Y in the arrangement shown in (b) of FIG. 6 is nearly a 45-degree negative oblique line as shown in FIG. 11. Therefore, the connection of the centers of the green and yellow subpixels G and Y may have a smooth profile.

Figure 12:
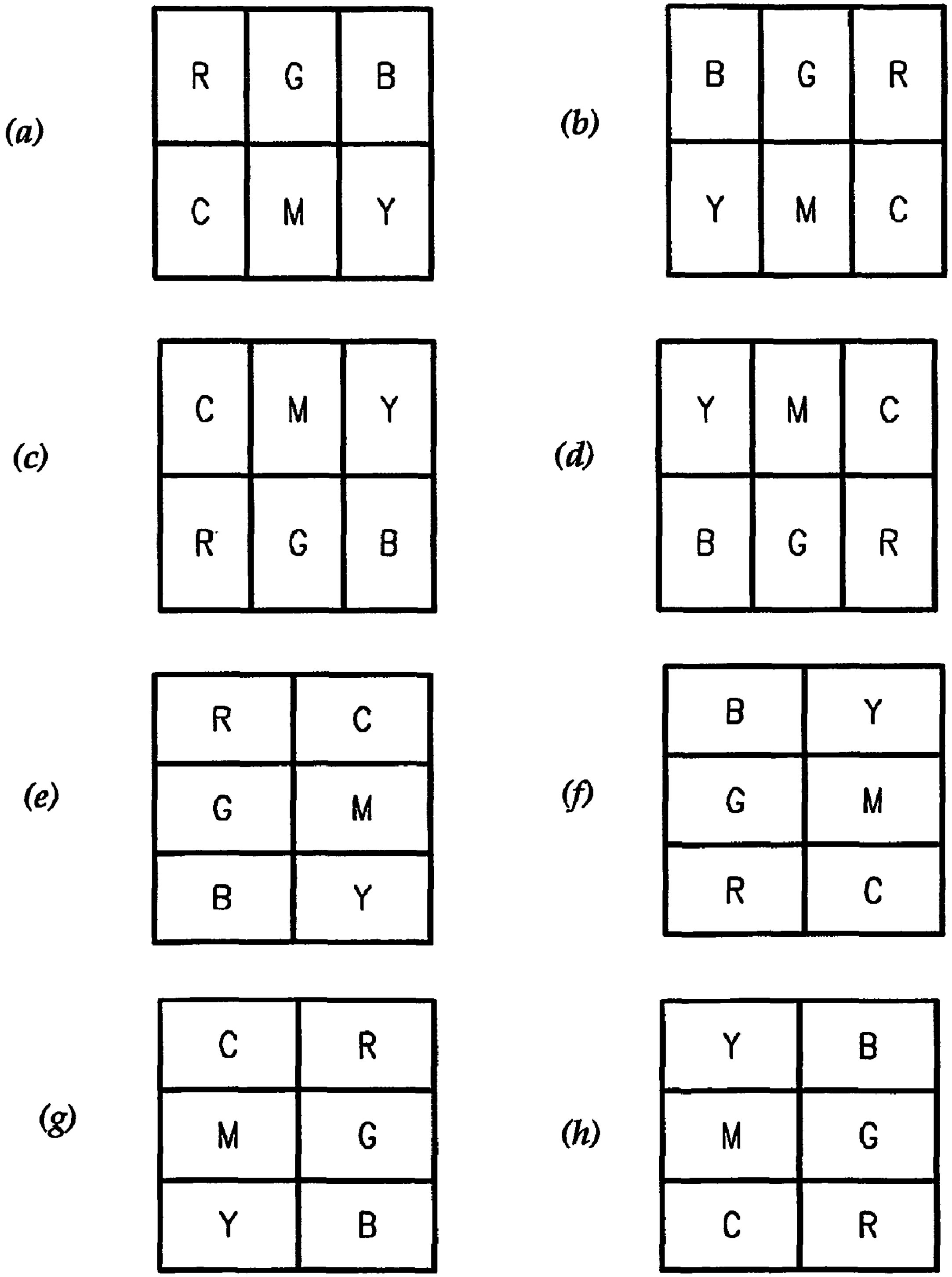
FIGS. 12 and 13 show subpixel arrangements modified from those shown in (a) and (b) of FIG. 6, respectively.
Figure 13:
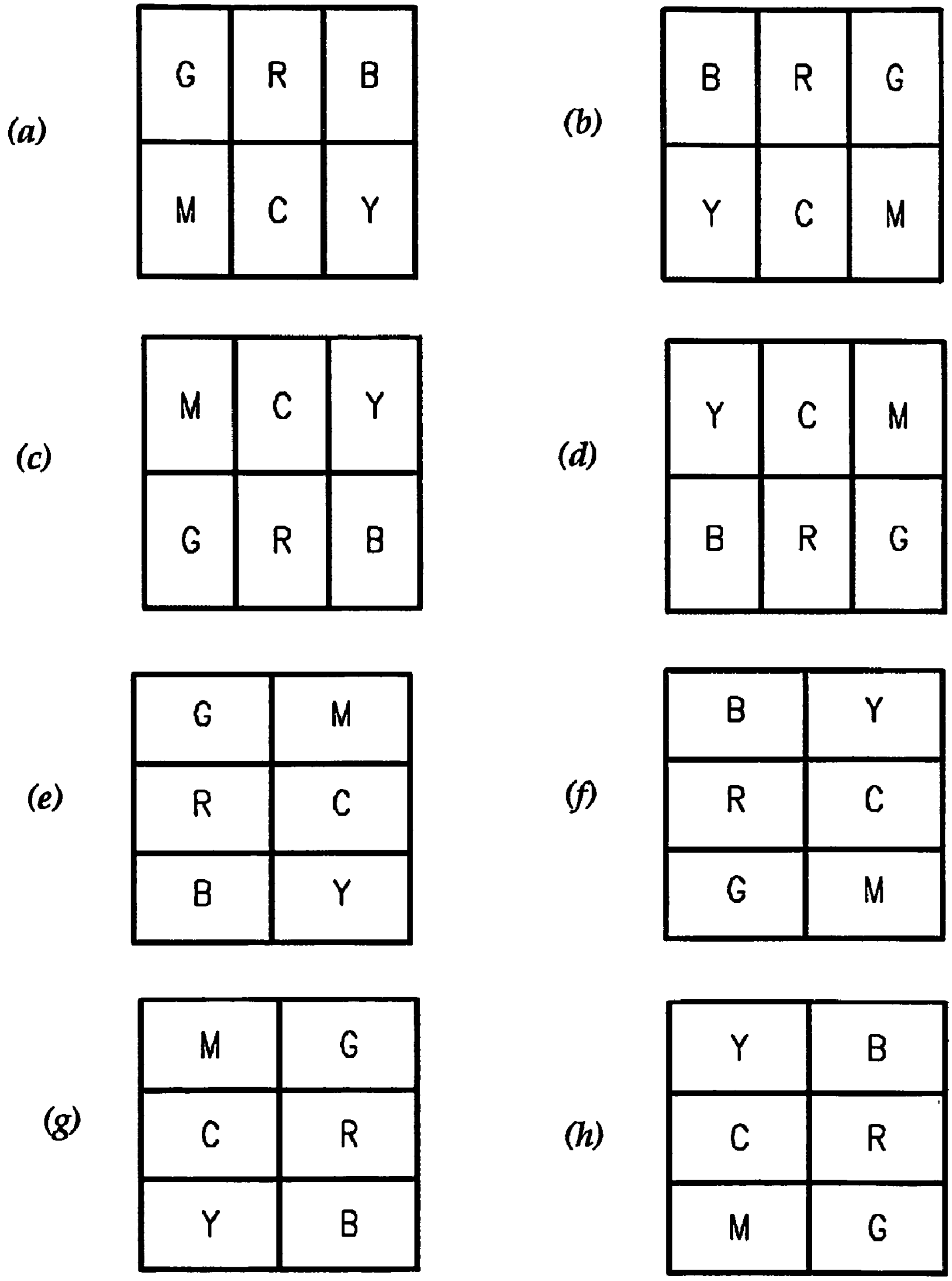

FIGS. 12 and 13 show subpixel arrangements modified from those shown in (a) and (b) of FIG. 6, respectively.

Referring to FIGS. 12 and 13, a set of first primary color subpixels, i.e., red, green, and blue subpixels R, G, and B are disposed in a row or a column, and thus a set of second primary color subpixels, i.e., cyan, magenta, and yellow subpixels C, M and Y are disposed in a row or a column. In addition, the subpixels having a complementary relation are disposed adjacent to each other.

The arrangements shown in FIG. 12 place the green subpixel G at the center, while it places the cyan and yellow subpixels C and Y at the sides.

The arrangements shown in (a) to (d) have shape of 2×3 matrix that includes a first row including the first primary color subpixels and a second row including the second primary color subpixels as shown in (a) and (b) or includes first row including the second primary color subpixels and a second row including the first primary color subpixels as shown in (c) and (d). The arrangements shown in (a) and (c) place the red and cyan subpixels R and C at the left side, which those shown in (b) and (d) place the red and cyan subpixels R and C at the right ride.

The arrangements shown in (e) to (h) are transposes of the arrangements shown in (a) to (d) in terms of matrix.

The arrangements shown in FIG. 13 place the green subpixel G and the yellow subpixel Y in a diagonal.

The arrangements shown in (a) to (d) have shape of 2×3 matrix that includes a first row including the first primary color subpixels and a second row including the second primary color subpixels as shown in (a) and (b) or includes first row including the second primary color subpixels and a second row including the first primary color subpixels as shown in (c) and (d). The arrangements shown in (a) and (c) place the green subpixel G at the left side, which those shown in (b) and (d) place the green subpixel G at the right ride.

The arrangements shown in (e) to (h) are transposes of the arrangements shown in (a) to (d) in terms of matrix.

The magenta subpixel may be substituted with a white subpixel for increasing the luminance, which will be described in detail.

Describing the reason why the magenta is replaced, red, green and blue are primary colors of light and very significant for the color range and the color representation, cyan color is dominantly contribute to the expansion of the color range, and yellow is the most sensitive color to human eyes, thereby making dominant effect on the visibility.

Figure 14:
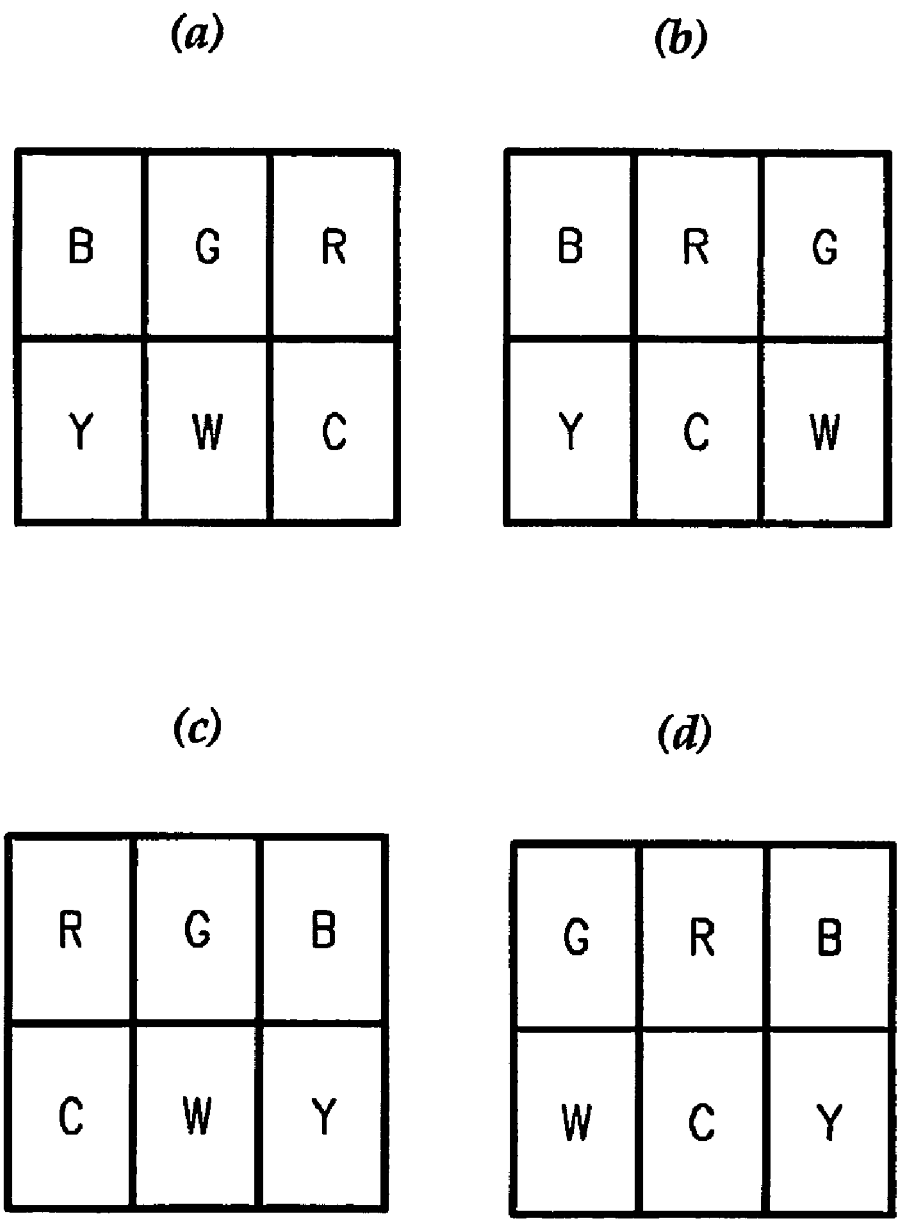
FIG. 14 shows subpixel arrangements according to other embodiments of the present invention.

FIG. 14 shows subpixel arrangements according to other embodiments of the present invention.

Referring to FIG. 14, the subpixels forming a pixel are arranged in a 2×3 matrix that includes a first row including red, green and blue subpixels R, G, and B and a second row including cyan, white, and yellow subpixels C, W and Y. The 2×3 matrix is approximately square and each subpixel may be square.

The subpixels R, B, C, and Y are arranged such that two complementary colors are adjacent to each other. That is, each pair of the red and the cyan subpixels R and C and the blue and the yellow subpixels B and Y, which have a complementary relation, are adjacent to each other. In addition, the green and the white subpixels G and W are adjacent to each other although they are not complementary.

The blue and yellow subpixels B and Y are disposed at the sides in the two rows for all the arrangements shown in (a) to (d). The green and the white subpixels G and W are disposed at the center in (a) and (c), while they are disposed at the right in (b) and (d).

Some experiments using giant subpixels were conducted for proving the appropriateness of the subpixel arrangements.

To arrange the subpixels in order of the luminance, it was the white subpixel W, the yellow subpixel Y, the green subpixel G, the red and cyan subpixel R and C, and the blue subpixel B.

First, white oblique lines having positive and negative gradients were displayed on a dark background for the arrangements shown in (a) and (b) of FIG. 14. The oblique lines had a width substantially equal to the width of a pixel and inclination angle of the oblique lines was about 45 degrees. Since the experimental results for the arrangements shown in (c) and (d) can be easily expected from the results for the arrangements shown in (a) and (b), the experiments for (c) and (d) were omitted.

In this experiment, the two oblique lines for the arrangement shown in (a) and (b) was observed to have slightly different widths, but it is not an eyesore. In addition, picture images displayed by the arrangements were observed to be excellent.

Figure 15:
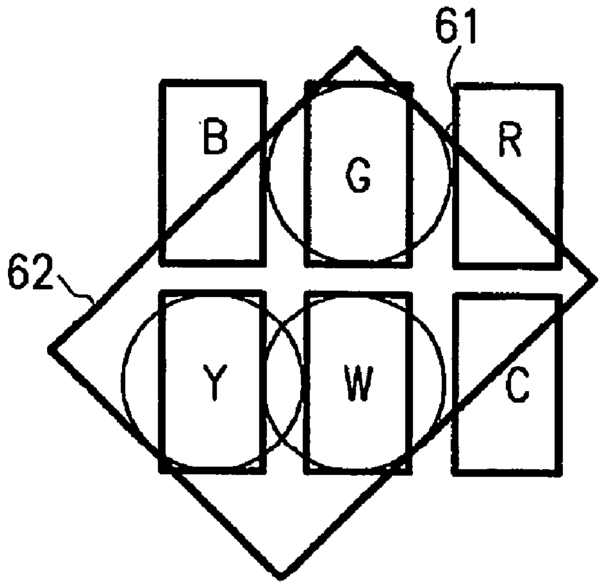
FIGS. 15 and 16 illustrate oblique lines displayed by the subpixel arrangement shown in (a) and (b) of FIG. 14.
Figure 16:
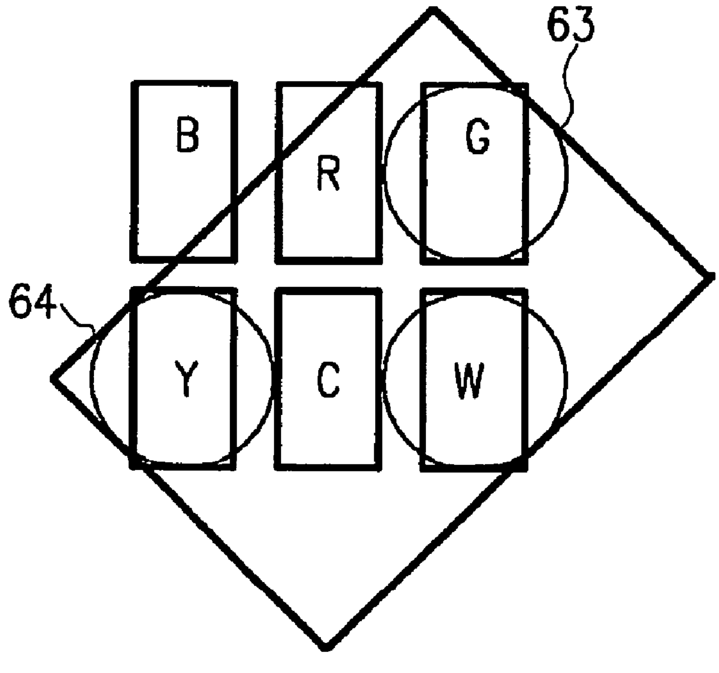

The above-described experimental results will be analyzed in detail with reference to FIGS. 15 and 16.

FIGS. 15 and 16 illustrate oblique lines displayed by the subpixel arrangement shown in (a) and (b) of FIG. 14.

Referring to FIG. 15, the arrangement shown in (a) of FIG. 14 arranges three brightest subpixels, i.e., white, yellow, and green subpixels W, Y and G, which are enclosed by circles. Accordingly, the width of the positive line, which is determined by the green and the white subpixels G and W as denoted by a reference numeral 61, is almost equal to the width of the negative line that is determined by the green and the yellow subpixels G and Y as denoted by a reference numeral 62.

On the contrary, the green, white, and yellow subpixels G, W and Y in the arrangement shown in (b) of FIG. 14 are obliquely arranged as shown in FIG. 16. Therefore, the width of the positive line, which is determined by the green or yellow subpixel G or Y and the white subpixel W as denoted by a reference numeral 63, is larger than the width of the negative line that is determined by the green and yellow subpixels G and Y as denoted by a reference numeral 64.

The arrangements in a form of 2×3 matrix can be transposed into 3×2 matrix like those shown in FIGS. 12 and 13.

FIG. 17 shows the luminance variation depending on the variation of magenta.

The first column denoted as "Magenta" indicates the thickness of the color filter 230 for magenta represented as microns. The magenta color becomes more as the color filter becomes thick. The second and third columns indicate color coordinates x and y and the last column denoted as "LUM" indicates the luminance.

The luminance is a percentage value with respect to a luminance for a 2-micron thickness of the magenta filter. The luminance is increased up to about 30% as the amount of the magenta is decreased, that is, the thickness of the magenta color filter is decreased.

The above description may be applicable to any display device such as a light emitting diode or plasma display panel.

The six-color subpixel arrangement may prevent the color error that appears near edges of the small characters and can reproduce an image that approaches the original image. The substitution of magenta with white in the above-described six-color arrangement may increase the luminance to increase the image quality.

In addition, the device and the method for converting three-color input image signals to six-color output image signals may provide increased luminance and concentration to a high quality TV.

Although preferred embodiments of the present invention have been described in detail hereinabove, it should be dearly understood that many variations and/or modifications of the basic inventive concepts herein taught which may appear to those skilled in the present art will still fall within the spirit and scope of the present invention, as defined in the appended claims.

What is claimed is:

1. A method of converting image signals by a signal controller for a display device including six-color subpixels, the signal controller including a magnitude comparator, a decomposer, a scaler and a signal extractor, the method comprising:

classifying three-color input image signals into maximum, middle, and minimum in the magnitude comparator;

decomposing the classified signals into six-color components in the decomposer;

determining a maximum among the six-color components; calculating a scaling factor in the scaler; and extracting six-color output signals in the signal extractor.

2. The method of claim 1, wherein the three-color signals comprise red, green and blue signals.

3. The method of claim 1, wherein the six-color signals comprise red, green, blue, cyan, magenta, and yellow signals.

4. The method of claim 3, wherein the decomposition comprises:

expressing a predetermined number of terms of coordinates with coefficients.

5. The method of claim 4, wherein the coefficients comprise first to third coefficients expressed as the maximum, middle, and minimum, and the coordinates are assigned to the six-color signals.

6. The method of claim 5, wherein the six-color components comprises a first term expressed as a multiplication of the first coefficient and first to sixth coordinates, a second term expressed as a multiplication of the second coefficient and the first, second, and sixth coordinates, and a third term expressed as a multiplication of the third coefficient and the first coordinate.

7. The method of claim 5, wherein the six-color components comprise a first term expressed as a multiplication of the first coefficient and first to sixth coordinates, a second term expressed as a multiplication of the second coefficient and the sixth coordinate, and a third term expressed as a multiplication of the third coefficient and the first coordinate.

8. The method of claim 6 or 7, wherein the first to the third terms are further decomposed into the first to sixth coordinates to be expressed as a multiplication of fourth to ninth coefficients and first to sixth coordinates.

9. The method of claim 8, wherein the calculation of the scaling factor comprising:

determining a maximum among the coefficients; and calculating a ratio of the maximum among the fourth to ninth coefficients and the maximum among the three-color signals to determine the scaling factor.

10. The method of claim 9, wherein the scaling factor is equal to or larger than one.

11. The method of claim 10, wherein the extraction of the six-color signals comprises:

multiplying the scaling factor to the fourth to ninth coefficients.

12. A device of converting image signals for a display device including six-color subpixels, the device comprising:

a signal controller converting three-color input signals into six-color output signals;

a gray voltage generator generating a plurality of gray voltages; and a data driver converting into the six-color signals into data voltages selected among the gray voltages and supplying the data voltages to the subpixels, wherein the signal controller comprises:

a magnitude comparator comparing the three-color signals;

a decomposer decomposing the three-color signals into six-color components;

a scaler calculating a scaling factor based on signals from the magnitude comparator and the decomposer; and a signal extractor multiplying the scaling fact to the six-color components.

13. The device of claim 12, wherein the three-color signals comprise red, green and blue signals.

14. The device of claim 13, wherein the six-color signals comprise red, green, blue, cyan, magenta, and yellow signals.

15. The device of claim 14, wherein the scaling factor is defined as a ratio of the maximum among the six-color components and the maximum among the three-color signals.

16. The device of claim 15, wherein the signal extractor obtains increments by multiplying the scaling factor to the six-color components.

17. A display device comprising:

a plurality of pixel arranged in matrix, each pixel including first and second sets of three primary color subpixels, wherein the subpixels are arranged so that two subpixels having complementary relation is adjacent to each other, and a subpixel having the lowest luminance is disposed at a side.

18. The device of claim 17, wherein the subpixels are arranged in a 2×3 matrix or a 3×2 matrix.

19. The device of claim 18, wherein the first set of three primary color subpixels are arranged in a row or a column, and the second set of three primary color subpixels are arranged in a row or a column.

20. The device of claim 19, wherein three subpixels having relatively high luminance are distributed over different rows or columns.

21. The device of claim 20, wherein the three high-luminance subpixels are distributed over two rows or two columns.

22. The device of claim 21, wherein the three high-luminance subpixels are arranged symmetrically in a row or column direction.

23. The device of claim 19, wherein two subpixels having relatively high luminance are arranged in a diagonal.

24. The device of claim 17, wherein the first or the second set of three primary color subpixels include a white subpixel.

25. The device of claim 17, wherein the first set of three primary color subpixels include red, green and blue subpixels, and the second set of three primary color subpixels include cyan, magenta, and yellow subpixels.

26. The device of claim 17, wherein the first set of three primary color subpixels include red, green and blue subpixels, and the second set of three primary color subpixels include cyan, white, and yellow subpixels.

27. The device of claim 24, wherein the subpixels are arranged in a 2×3 matrix or a 3×2 matrix.

28. The device of claim 27, wherein the first set of three primary color subpixels are arranged in a row or a column, and the second set of three primary color subpixels are arranged in a row or a column.

29. The device of claim 28, wherein the blue subpixel is disposed at a side.

30. The device of claim 29, wherein the green subpixel is disposed at a center.

31. The device of claim 30, wherein the green, cyan, and yellow subpixels have luminance higher than other subpixels.

32. The device of claim 29, wherein the green subpixel is disposed at a side.

33. The device of claim 32, wherein the green and yellow subpixels have a luminance higher than other subpixels.

* * * * *